United States Patent [19]

Sukigara

[11] Patent Number: 4,833,447
[45] Date of Patent: May 23, 1989

[54] INPUT DEVICE

[75] Inventor: Akihiko Sukigara, Tokyo, Japan

[73] Assignee: Canon Kabushiki Kaisha, Tokyo, Japan

[21] Appl. No.: 244,567

[22] Filed: Sep. 12, 1988

Related U.S. Application Data

[63] Continuation of Ser. No. 854,571, Apr. 22, 1986, abandoned.

[30] Foreign Application Priority Data

Apr. 27, 1985 [JP] Japan ................................. 60-89943
Apr. 27, 1985 [JP] Japan ................................. 60-89944
Apr. 27, 1985 [JP] Japan ................................. 60-89946

[51] Int. Cl.[4] .......................................... H03K 17/94
[52] U.S. Cl. ........................................ 341/25; 371/60
[58] Field of Search ............. 340/365 E, 365 S, 365 R

[56] References Cited

U.S. PATENT DOCUMENTS 3,745,536  7/1973  Klehm, Jr. ...................... 340/365 E
3,792,466  2/1974  Arnold et al. ................... 340/365 E
4,381,502  4/1983  Prame ............................ 340/365 S

*Primary Examiner*—Donald J. Yusko
*Assistant Examiner*—Alvin Oberley
*Attorney, Agent, or Firm*—Fitzpatrick, Cella, Harper & Scinto

[57] ABSTRACT

An input device relating to the manipulation of data indicating the depressed state of key switches and to the transmission of data and adapted for picking up on-off data on switches provided at the points of intersection of conductors disposed in the form of a matrix and for transferring these data to a microprocessor.

10 Claims, 9 Drawing Sheets

FIG. 4

|     | 12    | 13          | 21a 21b 21c — 14 |
|-----|-------|-------------|------------------|
| (1) | A     |             |                  |
| (2) | B     | A           | 0 A              |
| (3) | C     | A B         | 0 A 0 B          |
| (4) | D     | A B C       | 0 A 0 B 0 C      |
| (5) | D E   | A B C       | 0 A 0 B 0 C      |
| (6) | D E F | A B C       | 0 A 0 B 0 C      |
| (7) | D E F | A B C       | 1 A 0 B 0 C      |
| (8) | D E F | A B C       | 2 A 1 B 0 C      |
| (9) | D E F | A B C       | 3 A 2 B 1 C      |
| (10)| E F   | A B C D     | 0 D 3 B 1 C      |
| (11)| F     | A B C D E   | 1 D 0 E 2 C      |
| (12)|       | A B C D E F | 2 D 1 E 0 F      |
| (13)|       | A B C D E F | 3 D 2 E 1 F      |
| (14)|       | A B C D E F | 3 E 2 F          |
| (15)|       | A B C D E F | 3 F              |

INPUT DEVICE

This application is a continuation of application Ser. No. 854,571, filed Apr. 22, 1986, now abandoned.

BACKGROUND OF THE INVENTION

Field of the Invention

The present invention relates to an input device for processing key data fed from a key matrix.

Description of the Prior Art

Conventional devices of this kind include input devices for processing key-in data fed from a key matrix in which diodes are not used.

Generally, in such devices, three keys pushed down at a time function as if four keys have been simultaneously pushed down. For this reason, they are so designed that the number of keys may be effective at one time is restricted to two and if a third key is pushed, it is locked out. Another type of device has diodes disposed in the form of a key matrix such as to maintain key-in data. This is known as the N-key-roll-over type and is capable of processing n-units of key-in data at a time. According to this method, however, the number of diodes that must be provided must be in the ratio of 1:1 relative to of the number of key matrix points, thus heightening the cost of the device.

In conventional devices of these kinds, the I/O (input/output) including the data exchanges and the control command that take place between a main processor, namely, a main CPU and a sub processor, namely, a sub CPU interfacing with the same, is carried out in such a manner that data is input and output through a data bus, and control signals flow between each I/O device through a control bus while a data bus, an address bus and a control bus communicate with each other. Accordingly, when, in an 8-bit system for example, 8-bit data is transferred from data inputs $A_0$ to $A_7$ to the main CPU, the main system is generally designed to be interrupted through an independent IRQ (interrupt request) terminal.

When, in this state, each of the interfaces is extended, that is, the system is changed such as to have additional or improved functions, anticipative functions must be limited because of the restriction on the number of ports. Moreover, the number of ports itself must be increased, as the number of signal lines for indicating the state of control between the main CPU and the sub CPU is increased in such a case.

Since the conventional devices have been arranged in the manner described above, there has been a limitation on the acceptable number of effective key-in operations which can be applied simultaneously, thus lowering key-input efficiency.

In such conventional devices, a key encoder incorporated in a keyboard carries out interpretation of the key-in data input thereto by a keyboard operation, and it feeds code data thereby encoded to a CPU in a typewriter or the like. A switch (hereinafter referred to as a cover switch) is attached to a cover accommodating each of the devices constituting the typewriter. The opened and closed states of the cover are thereby observed, thus preventing chattering, etc. Data on the opened and closed states fed from the cover switch is transferred, without passing through the key encoder, to the CPU in the body of the typewriter or the like, the CPU carrying out interpretation and control.

The CPU must observe the open/closed state of the cover switch each time opening or closing action of the cover switch occurs. This is such a heavy load for the CPU that it fails to properly control other devices.

SUMMARY OF THE INVENTION

The present invention aims to eliminate the above defects, and an object of the present invention is to provide a low-cost input device capable of performing N-key roll over.

Another object of the present invention is to provide an input device in which data representing the open/closed state of a cover switch input therefrom is encoded in an encoder and the code data thereby encoded is fed to a main CPU, thus largely reducing the load placed on the main CPU and heightening key-input efficiency.

Still another object of the present invention is to provide an input device in which groups I/O (input/output) of control commands and data flowing between a main CPU and a sub CPU functioning in accordance with a command of the main CPU share one data line so as to increase the number of logical ports.

The present invention provides in one of its aspects an input device in which key switches disposed in the form of a key matrix feed key-in information to a scroll buffer each time a key switch is depressed, the key-in information being successively stored in the scroll buffer, and items of key-in information continuously fed to this scroll buffer are then stored in a key buffer in the order of key-in operation and are written in a off-waiting buffer, thus successively receiving key-in information when a plurality of key switches are pushed down. The off-state of the key switches having fed key-information which is retained by the off-waiting buffer is counted successively each time it is informed, and the key-in information is erased from the off-waiting buffer when the counted number becomes equal to a given number.

The present invention provides in another of its aspects an input device in which a code feeding means interprets the information on the open/closed states of a cover switch which is input in the code feeding device through a key matrix, and feeds the open-closed code thereby encoded to a main processing device in, for example, a typewriter.

The present invention provides in still another of its aspects an input device in which data control means provided in main and sub processing devices complexly control the mode of one line so as to provide communication between a control signal and a data signal or between control signals.

BRIEF DESCRIPTION OF THE DRAWINGS

FIG. 4 is a diagram illustrating the transitive state of a flow of key-in information according to the present invention;

DESCRIPTION OF THE PREFERRED EMBODIMENTS

Figure 1:
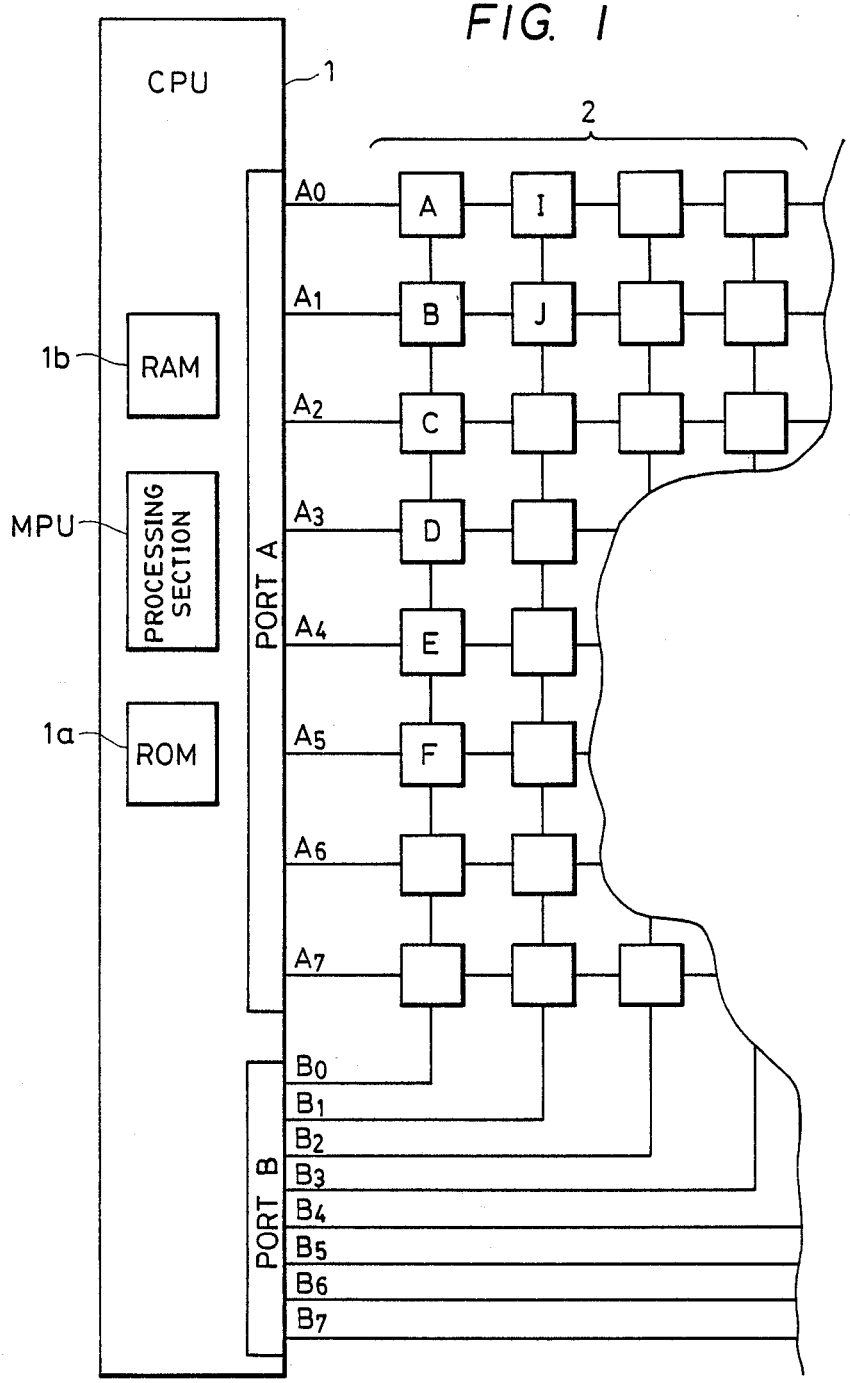
FIG. 1 is a diagram showing the constitution of an input device which is the first embodiment of the present invention.

FIG. 1 shows the constitution of an input device which is an embodiment according to the present invention and which has a CPU 1, a processing section MPU, a ROM 1a in which the control process later described is stored, a RAM 1b for memorizing data, a port A for receiving key-in information from a group of key switches 2 disposed in the form of a key matrix, and a port B through which scanning signals are output from the CPU 1. The ports A and B are, for example, the 8-bit type and have port inputs $A_0$ to $A_7$ and port outputs $B_0$ to $B_7$.

Figure 2:
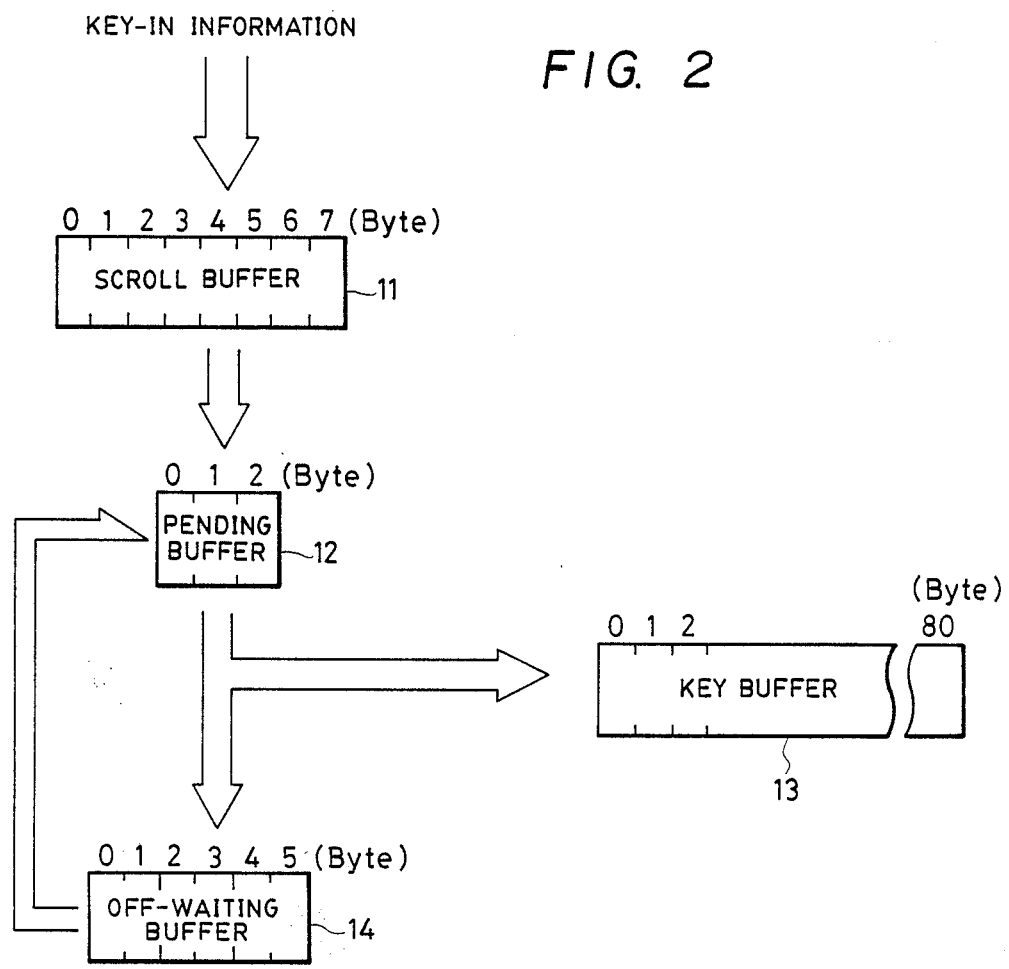
FIG. 2 is a block diagram showing the function of a CPU shown in FIG. 1.

FIG. 2 is a block diagram showing the function of the CPU shown in FIG. 1 and particularly illustrating each item of data memorized in the RAM. Referring to this figure, a numeral 11 denotes a scroll buffer which successively receives key-in information such as "A" to "C" when desired key switches in the group of key switches 2 are depressed, and which stores the key-in information in the form of 8-byte. A numeral 12 denotes a pending buffer of, for example, 3-byte, which stores items of key-in information which is the key-in information continuously fed thereto from the scroll buffer 11. A numeral 13 denotes a key buffer or a document memory of, for example, more than 80-byte, which stores, in order of key-in, the key-in information continuously fed to the pending buffer 12. A numeral 14 denotes an off-waiting buffer of, for example, 6-byte, which counts the key-in information stored in the key buffer and the key-off state relative to this information each time a key switch is operated, and which deletes the key-in information when the counted value becomes equal to a given number.

Figure 3:
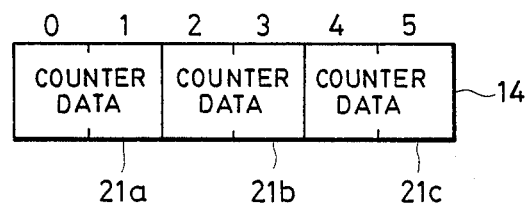
FIG. 3 is a diagram schematically showing the data division at an off-waiting buffer shown in FIG. 2.

FIG. 3 schematically illustrates data division at the off-waiting buffer 14 shown in FIG. 2, in which count data 21a to 21c are stored and divided into 2-byte groups.

The operation of the embodiment shown in FIGS. 1 and 2 will now be described with reference to FIG. 4.

FIG. 4 is a diagram illustrating the transitive state of the flow of key-in information according to the present invention. In this figure, the same elements as those in FIG. 2 are given the same numerals, and numerals (1) to (15) indicate steps in a key switch procedure. The key information flow is described hereunder with respect to the case in which keys A to F in the group of key switches 2 are successively depressed. The procedures for each step are stored in the ROM 1a and analyzed through the processing section MPU, thus being controlled.

When the key A is depressed, a scanning signal is fed from the output port B to the port A through the key A, and a signal representing the key A is input into the scroll buffer (SB) 11. Simultaneously, key-in information "A" is stored at the head of the pending buffer (PB) 12 (1). Next, if the key B is depressed while the key A is being depressed, and if both keys A and B are recognized, the key A is regarded as "on" and the key-in information "A" is stored in the key buffer (KB) 13, since the key-in information "A" has already been stored in the PB 12. The key-in information "A" is at the same time stored in the off-waiting buffer (OWB) 14, and the count data 21a is set at "0" (indication of key-on state) (2). If the key C is depressed while the keys A and B are being depressed, the keys A to C are recognized. In this state, as the key A is still on while in the off-waiting state, the count data 21a is not renewed and is set to be "0". Since key-in information "B" has been registered in the PB 12, the key B is regarded as "on", and the key-in information "B" is stored in the KB 13 and the OWB 14, the count data 21b being set to be "0" (3). If the key D is depressed while the keys A to C are being depressed, the keys A to D are recognized. As the keys A and B are still on while in the off-waiting state, the count data 21a and 21b are not renewed and are set to be "0". Since the key-in information "C" has been registered in the PB 12, the key C is regarded as "on", and the key-in information "C" is stored in the KB 13 and the OWB 14, the count data 21c being set to be "0". At this time, key-in information "D" is stored in the PB 12 (4). When the key E is depressed, the keys A to E are recognized. As the keys A to C are still on while in the off-waiting state, the count data 21a to 21c are not renewed and are set to be "0". Although the key-in information "D" has been registered in the PB 12, it is maintained in the same state, since there is no space in the OWB 14. Key-in information "D" on key-in action thereafter applied is stored after the key-in information "D" (5). Then, when the key F is depressed, the keys A to F are recognized. As the keys A to C are still on while being in the off-waiting state, the count data 21a to 21c are not renewed and are set to be "0". Although each item of the key-in information "D" and "F" has been registered in the PB 12, it is maintained in the same, since there is no space in the OWB 14. Key-in information "F" on key-in action of the key F thereafter applied is stored at the stage following the key-in information "D" and "F" (6). If, in this state, the key G is depressed, key-in information on the key G is not registered in any buffer, since there is no space in the PD 12 and the OWB 14. When the key A is released, the keys B to F are recognized. At this time, the count data 21a is renewed by "1" and the OWB 14 resumes the off-waiting state. The count data 21b and 21c are not renewed since the keys B and C are still on (7). When the key B is released, the keys C to F are recognized. At this time, the count data 21a is renewed so as to be "2", while the count data 21b is renewed so as to be "1" and the OWB 14 resumes the off-waiting state. The count data 21c is not renewed and set so as to be "0" since the key C is still on. The keys D to F are maintained at the same state since there is no space in the OWB 14 (8). When the key C is released, the count data 21a to 21c in the OWB are renewed by "1" (9). At this time, as the count data becomes "3", the key A is regarded as "off" and the the key-in information on the key A is deleted from the OWB 14. Then, the key D which is one of the keys still being on and which has been registered in the PB 12 at the earliest time is regarded as "on", and it is stored in the KB 13 and the OWB 14. The key-in information "D" is thereby removed from PB 12 and each item of following key-in information "E" and "F" is shifted into and stored in the PB 12 (10). When the key D is released, the count data 21a to 21c in the OWB 14 is renewed by "1". At this time, as the count data 21b becomes "3", the key-in information "B" is deleted from the OWB 14. Then, the key E which is one of the keys still being on and which which has been registered in the PB 12 at the earliest time (as the head data in the PB 12) is regarded as "on", and the key-in information "E" is stored in the KB 13 and the OWB 14. The key-in information "E" is deleted from the PB 12, and the following key-in information "F" is shifted to the head of the PB 12 and is stored therein (11). When the key E is released, the count data 21a to 21c in the OWB 14 is renewed by "1", respectively. At this time, as the count data 21c becomes "3", the key C is regarded as "off" and the key-in information "C" is deleted from the OWB 14 so that a space is prepared in the OWB 14. In this spaced area, the key-in information "F" is stored. In this state, PB 12 does not contain any data, and the OWB 14 is in the off-waiting state (12). As no key-in information is fed by the next scanning, the count data 21a to 21c are renewed so as to remove the key-in information "D" (13). Successively, the same scanning is carried out, and no key-in information is obtained. Then the count data 21a to 21c in the OWB 14 are renewed so as to remove the key-in information "E" (14), (15). As a result, in the KB 13 is stored each item of key-in information "A" to "F" in order of key-in operation.

The key-in information receiving process is further described with reference to FIG. 5.

Figure 5:
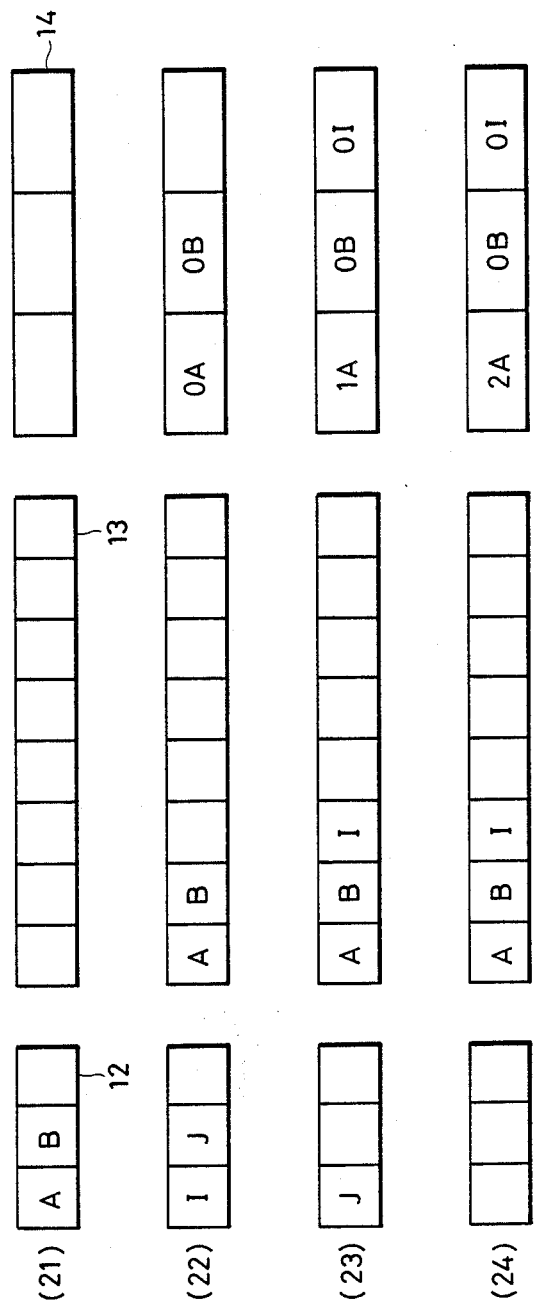
FIG. 5 is a diagram illustrating data transition during the operation of receiving key-in information.

FIG. 5 illustrates data transition during the operation of receiving key-in information. Numerals (21) to (24) indicate each step in the procedure.

When the keys A and B are depressed at the same time (21), items of key-in information "A" and "B" are stored in the PB 12. Then, when the key I is depressed, each item of key-in information "A" and "B" having been registered is regarded as on-state information and is registered in the KB 13, and the count data 21a and 21b in the OWB 14 are set at "0". At this time, when key-in information "J" is entered in the PB 12, four keys are depressed, in effect. Accordingly, the key-in information "J" is not entered in the KB 13 (22). Then, when the key A is released, the key-in information "J" is erased and items of key-in information "B" and "I" are recognized and registered in the KB 13 and the OWB 14 (23). If, at this time, the number of key-in operations is counted, key-in information which is accepted in effect is two items of key-in information "B" and "I". Accordingly, the key-in information "J" registered in the PB 12 is erased from the PB 12 as an assumptive key-in information (24).

In the embodiment described above, the storing space of the OWB 14 is adapted for accommodating key-in information on three keys. However, by providing the capacity for n-key information, the key-input operation more equivalent to N-key roll over can be realized.

Figure 6:
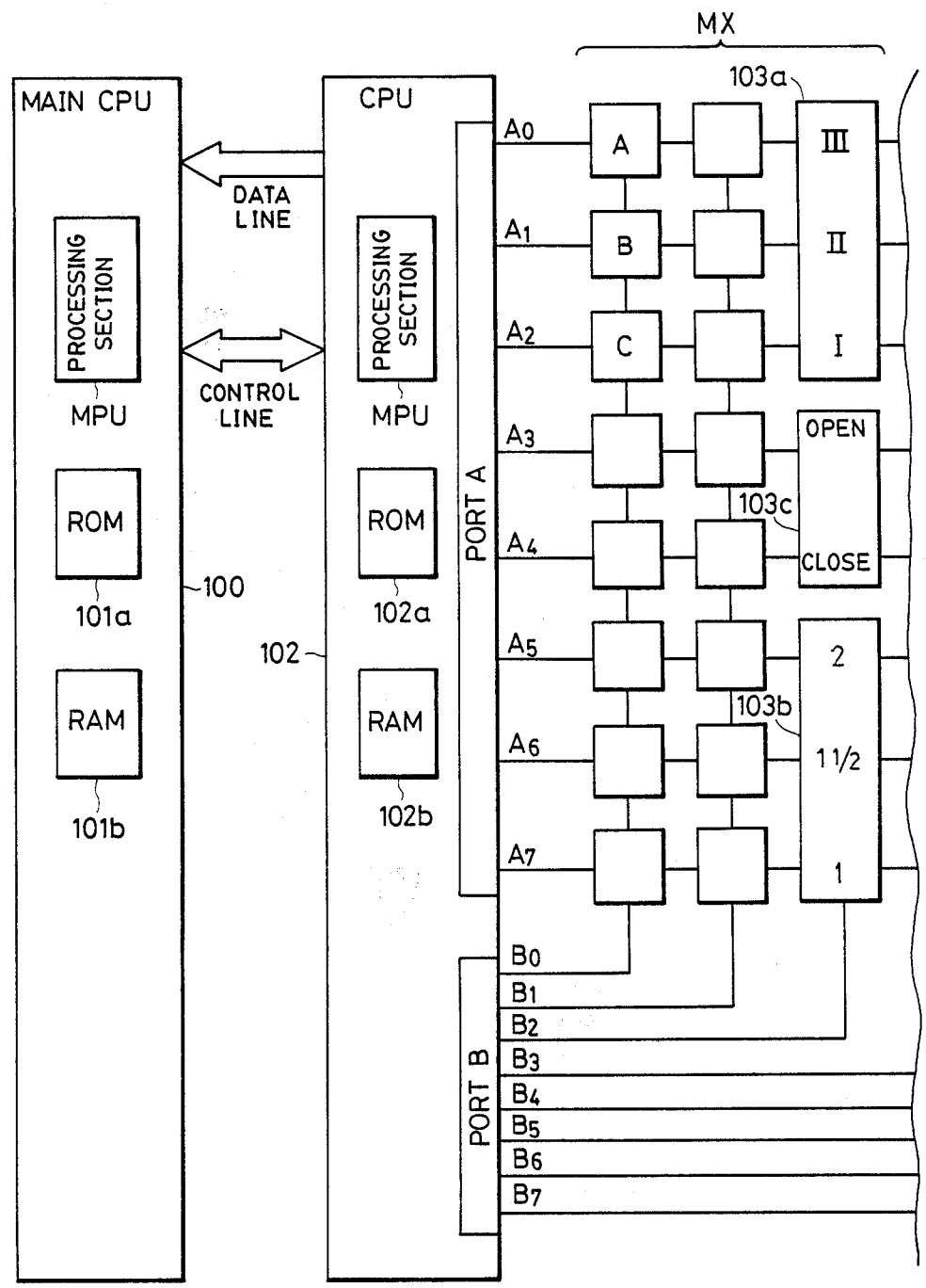
FIG. 6 is a diagram illustrating a key matrix adapted to an input device which is the second embodiment of the present invention.

FIG. 6 shows a key matrix constituting an input device which is the second embodiment of the present invention. In this figure, a numeral 100 denotes a main CPU constituting a main processing device and carrying out control such as operation of storing, for example, font data in a buffer in accordance with encoded character code information. The main CPU 100 has a processing section MPU, a ROM 101a in which the processing procedure is stored, and a RAM 101b for storing data. A numeral 102 denotes a CPU constituting a code feeding means according to the present invention, which interprets and encodes open-close information on sliding switches 103a and 103b and a cover switch 103c disposed in a key matrix MX so a to feed encoded open-closed information to the main CPU 100. The CPU 102 has ports A and B connected to the key matrix MX and has input lines $A_0$ to $A_7$ and output lines $B_0$ to $B_7$ of 8-bit. The CPU 102 also has a processing section, a ROM 102a in which processing procedures are stored, and a RAM 102b for storing data. The sliding switch 103a is designed, for example, to set printing pressure at three degrees (I to III), the sliding switch 103b is designed, for example, to select line spaces at three degrees (2, 1 ½, 1).

Next, the code feeding control process according to the present invention will be described with reference to FIG. 7.

Figure 7:
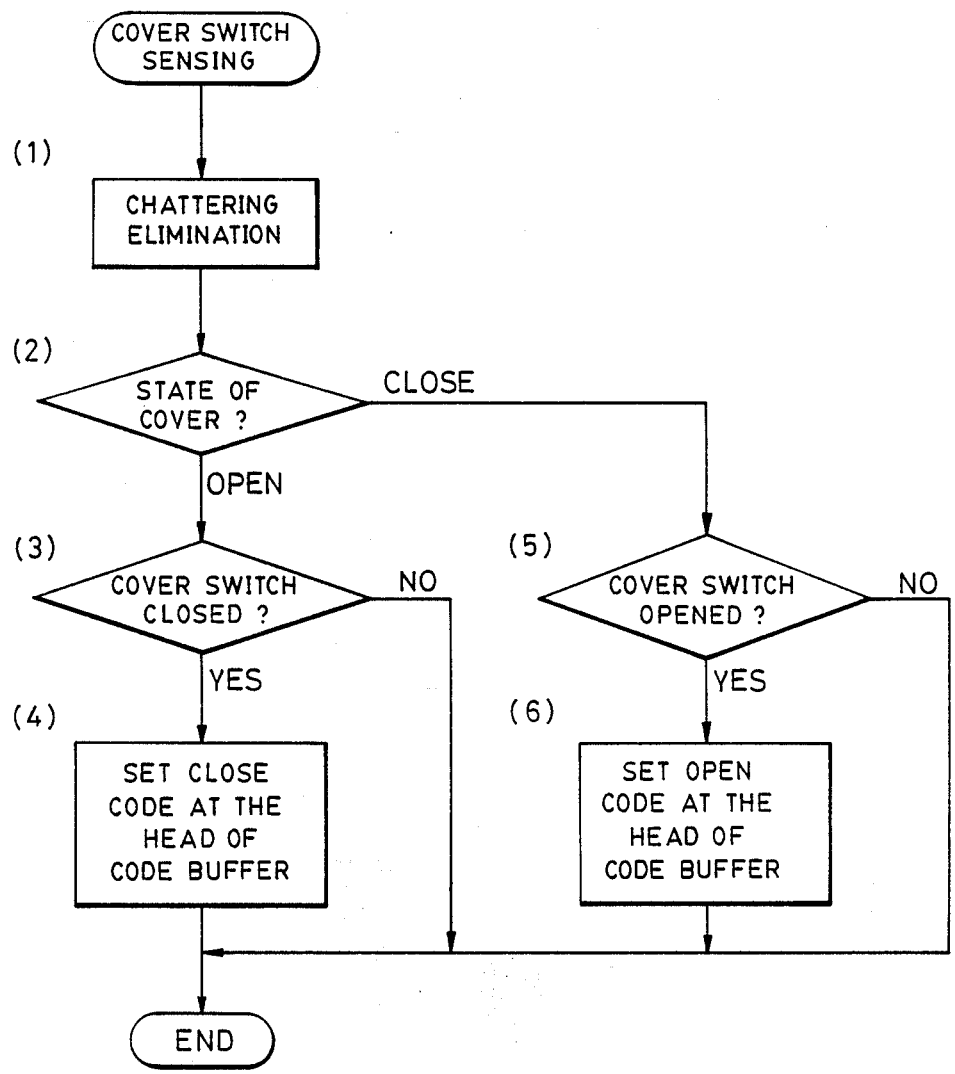
FIG. 7 is a flowchart illustrating the operation of code feeding control according to the present invention.

FIG. 7 is a flow chart illustrating the code feeding control process according to the present invention, in which numerals (1) to (6) indicate each step of the process.

In the first place, chattering of a key is eliminated (1), and whether the cover of the apparatus at this time is opened or closed is judged (2). In the case of OPEN, whether the cover switch 103c is closed or not is judged (3). The function of this cover switch 103c is such that it is opened at one side thereof while being closed at the other side. In the case of YES in this judgement, that is, the cover switch is closed, the cover switch is assumed to be changed from the closed state to the opened state, and a close code is stored at the head of a code buffer (not shown) in the CPU 102. If, at this time, the result of the judgement is regarded as NO, that is, the cover switch is open, the control process comes to an end.

On the other hand, If the present state of the cover is closed state, whether the cover switch is open or not is judged (5). In the case of YES, that is, the cover switch is open, an open code is stored at the head of the code buffer, and the process comes to an end (6). In the case of NO, the cover switch 103c is judged to be closed, the control process comes to an end.

Figure 8:
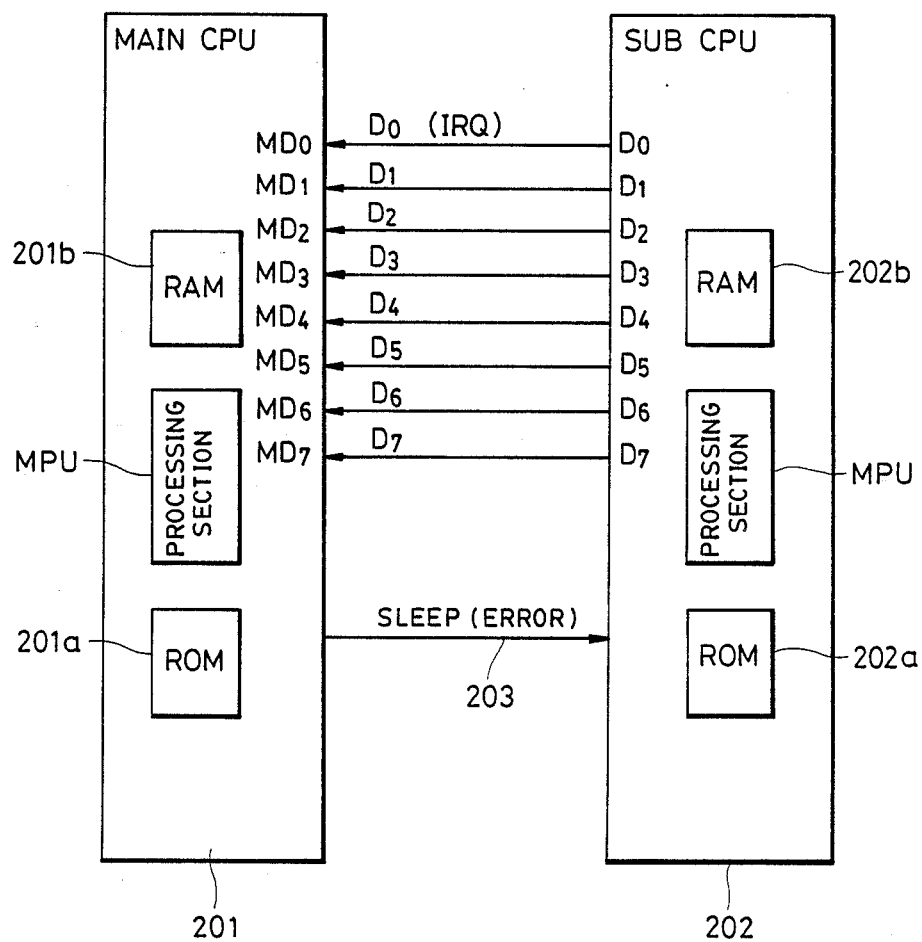
FIG. 8 is a control block diagram of an input device which is the third embodiment of the present invention.

FIG. 8 is a control block diagram of an input device which is the third embodiment of the present invention. In this figure, a numeral 201 denotes a main CPU having a processing section MPU, a ROM 201a in which the control procedure is stored, a RAM 201b for storing data, and 8-bit data lines $MD_0$ to $MD_7$. A numeral 202 denotes a sub CPU having data controlling means and functioning in subordination to the main CPU 201. The sub CPU 202 is the type having data control means and is provided in, for example, key boards, etc. and it has processing section MPU, an ROM 202a in which the control procedure is stored, a RAM 202b for storing data, and 8-bit data lines $D_0$ to $D_7$. The sub CPU 202 sets the data line $D_0$ at "0", that is, it feeds "10000000" to the data lines $MD_0$ to $MD_7$ in the main CPU 201 at the time immediately before the step of data feeding so as to inform the main CPU 201 of data request IRQ. Address lines, etc. are omitted in this description. A numeral 203 denotes a control line through which an error signal ERROR is fed from the main CPU 201 to the SUB CPU 202 at the time of initialization and through which a sleep signal SLEEP indicating the waiting state of the main CPU 201 having finished processing is fed therefrom to the sub CPU 202.

Figure 9A:
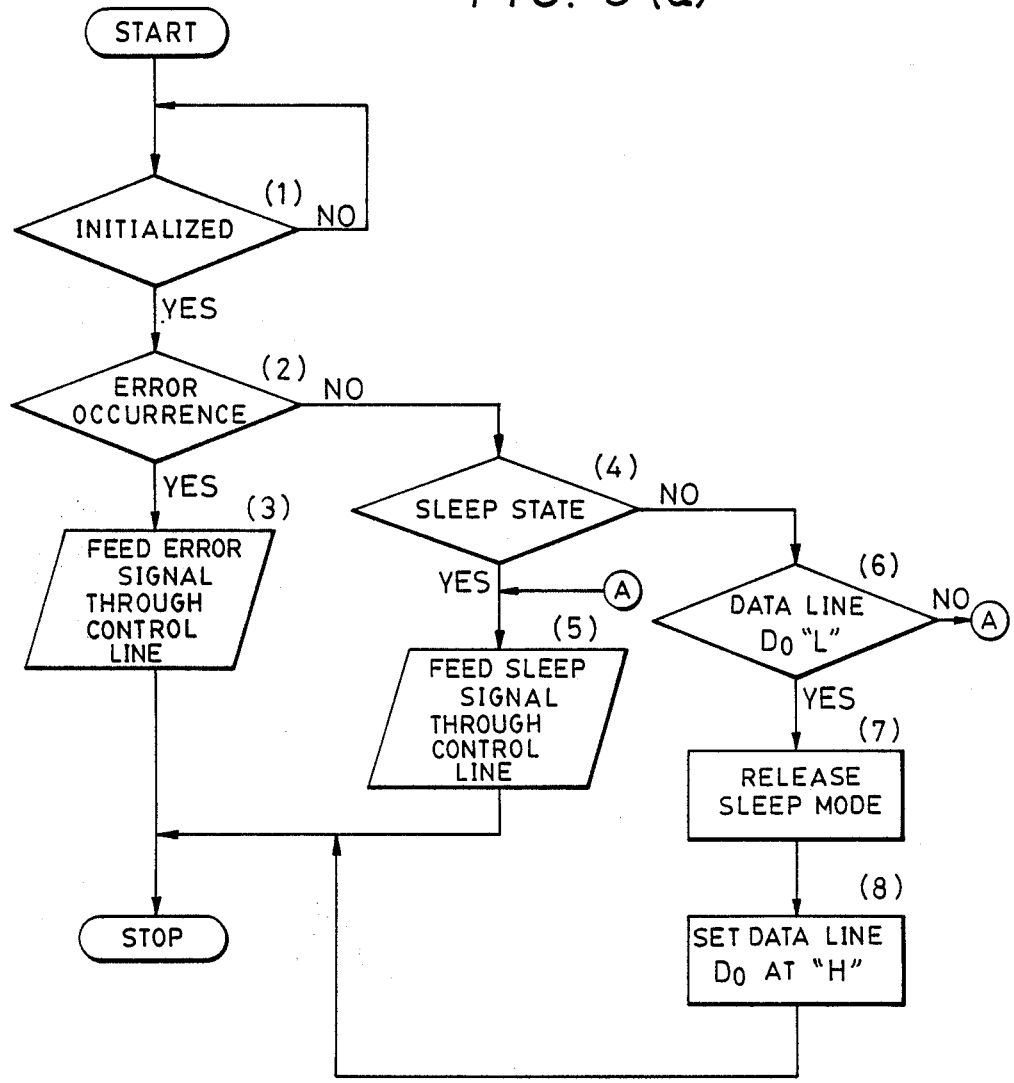
FIG. 9(a) is a flowchart illustrating the operation of receiving data carried out by the input device shown in FIG. 1.

The operation of the device shown in FIG. 8 is described with reference to FIGS. 9(a) and (b).

Figure 9B:
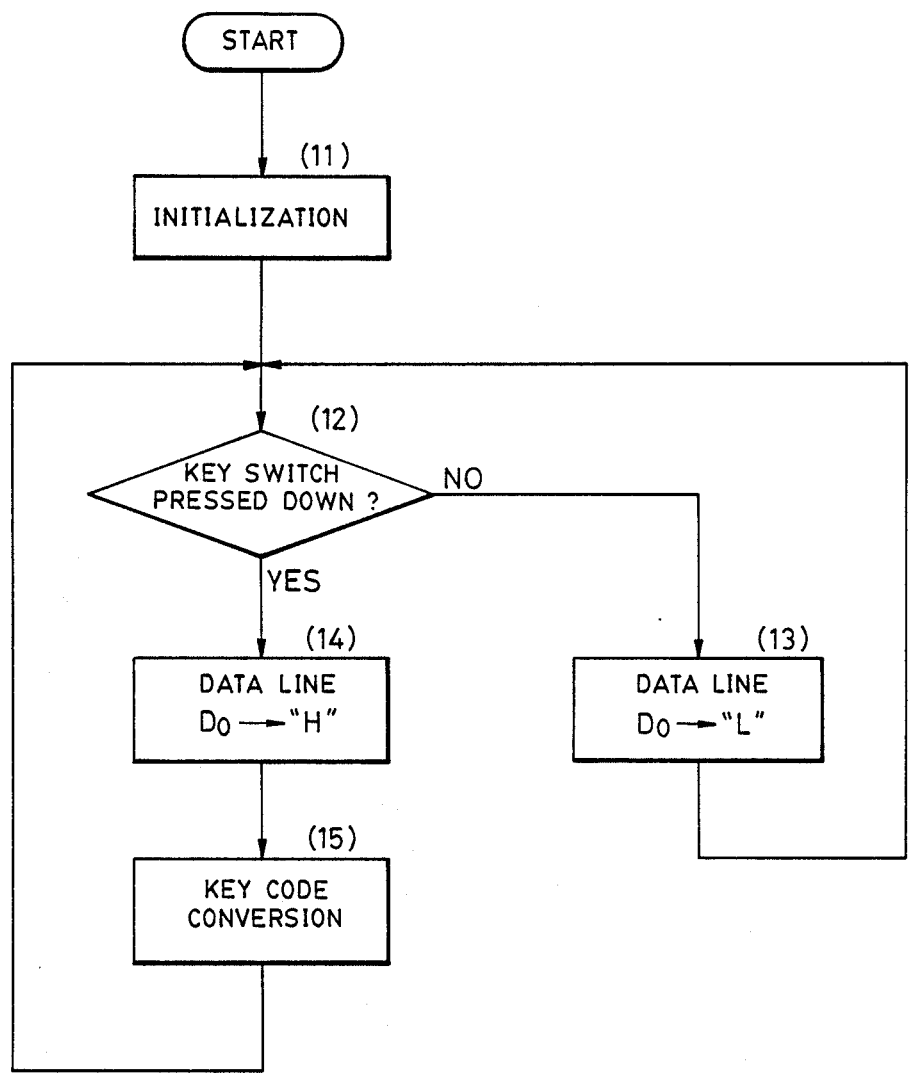
FIG. 9(b) is a flowchart illustrating the control operation of a sub CPU shown in FIG. 1.

FIG. 9 is a flowchart illustrating the data receiving process of the input device shown in FIG. 8, in which reference notes (1) to (8) indicate each step of the process.

The main CPU waits the completion of initialization (1), and judges whether errors exist or not by employing the processing section MPU provided therein (2). When it is judged that errors exist, the main CPU 201 feeds an error signal ERROR to the sub CPU 202 through the control line 203 and finishes the control process (3). When it is judged that any error does not exist, whether the present state is sleep state or not is judged (4). In the case of YES, the main CPU 201 feeds a sleep signal SLEEP to the sub CPU 202 through the control line 203 and finishes the control (5). On the other hand, if, in the judgment at the step (4), it is judged that the present state is not the sleep state, the main CPU 201 proceeds to the normal mode and judges whether or not the data line $D_0$ of the sub CPU 202 is at the level of "L" (6). If YES, the main CPU 201 releases the sleep mode and receives the data fed from the sub CPU 202 and stores the same in the RAM 201$b$ (7). After the sub CPU 202 has completed an operation of feeding data, the data line $D_0$ is set at the level of "H", and the control process comes to an end (8). On the other hand, if NO in the step (6), the process is returned to the step (5), and the main CPU 201 feeds a sleep signal SLEEP to the sub CPU 202 through the control line 203. Then, the process comes to an end.

FIG. 9($b$) is a flowchart illustrating the process of controlling the sub CPU 202, in which numerals (11) to (15) indicate each step of the process.

In the first place, intialization is carried out at each part (11). Then, whether a key switch of the keyboard is pushed down of not is judged (12). If NO, the data line $D_0$ is set at "L", and the process continues waiting a key pushing operation (13). If YES, the data line $D_0$ is set at the level "H" (14), and the key-in information on key switch is converted to a key code (15). Then the process returns to the step (12).

The above embodiment has been described with respect to the sub CPU alone. Any CPU incorporated in a sub-system subordinate to the main CPU 201 can be substituted for this. It is a matter of course that the present invention is applicable to CPUs incorporated in keyboards, indicators, printers and the like.

What is claimed is:

1. An input device comprising:
   first memory means for storing a plurality of pieces of key information on each of key switches;
   second memory means for storing said plurality of pieces of key information stored in said first memory means;
   third memory means for storing said plurality of pieces of key information stored in said first memory means; and
   control means for moving key information of said first memory means to said second memory means, and for storing said key information in said third memory means when said key information is transferred from said first memory means to said second memory means in the event that said third memory means is able to receive key information from said first memory means, said control means storing said key information of a released key switch in said third memory means during a given time after each of said key switches is released from the depressed state.

2. An input device according to claim 1, further comprising a means for controlling said memory means in the manner such that said second memory means does not accept any new key information form said first memory means when said third memory means is overflowing.

3. An input device according to claim 1, further comprising a means for controlling said memory means in the manner such that when said third memory means is overflowing, said second memory means does not accept any new key information from said first memory means until a space for storing new information is prepared.

4. An input device according to claim 1, further comprising a means for deleting key information memorized in said first and third memory means when a given time has passed after turning of each of said key switches from the on state to the off state.

5. An input device according to claim 1, wherein said key switches are disposed so as to be opened and closed at the points of intersection of a network in the form of a matrix.

6. An input device according to claim 1, wherein each of said first and third memory means has capacity for storing a plurality of items of key information.

7. An input device comprising:
   switch means closed and opened at the points of intersection of a network in the from of a matrix;
   first memory means, connected to said switch means, for storing a plurality of pieces of key information on key switches;
   second memory means for storing said plurality of pieces of key information stored in said first memory means;
   third memory means for storing said plurality of pieces of key information stored in said first memory means;
   control means for moving key information of said first memory means to said second and third memory means in parallel; and
   means for deleting, after said information is transferred from said first memory means to said second and third memory means, the transferred information stored in said first memory means.

8. An input device according to claim 7, further comprising a means adapted for feeding a scanning signal and placed at one end of said network in the form of a matrix.

9. An input device according to claim 7, further comprising a means for preventing key information from transferring from said first memory means to said third memory means when the same memory means is overflowing.

10. An input device according to claim 7, wherein said first and second memory means are capable of memorizing information on said plurality of switch means.

* * * * *

UNITED STATES PATENT AND TRADEMARK OFFICE
CERTIFICATE OF CORRECTION

PATENT NO. : 4,833,447
DATED : May 23, 1989
INVENTOR(S) : AKIHIKO SUKIGARA

It is certified that error appears in the above-identified patent and that said Letters Patent is hereby corrected as shown below:

COLUMN 1

Line 28, "of" (first occurrence) should be deleted.

COLUMN 5

Line 7, "which which" should read --which--.

COLUMN 6

Line 4, "so a" should read --so as--.
Line 35, "If" should read --if--.
Line 40, "closed, the" should read --closed, and the--.

COLUMN 7

Line 11, "any" should read --an--.
Line 33, "intialization" should read --initialization--.
Line 35, "of" should read --or--.

UNITED STATES PATENT AND TRADEMARK OFFICE
CERTIFICATE OF CORRECTION

PATENT NO. : 4,833,447
DATED : May 23, 1989
INVENTOR(S) : AKIHIKO SUKIGARA

Page 2 of 2

It is certified that error appears in the above-identified patent and that said Letters Patent is hereby corrected as shown below:

COLUMN 8

Line 9, "form" should read --from--.

Signed and Sealed this

Thirteenth Day of March, 1990

Attest:

JEFFREY M. SAMUELS

Attesting Officer     Acting Commissioner of Patents and Trademarks